United States Patent
Yang

(10) Patent No.: US 12,033,691 B2
(45) Date of Patent: Jul. 9, 2024

(54) READOUT CIRCUIT LAYOUT STRUCTURE, READOUT CIRCUIT, AND MEMORY LAYOUT STRUCTURE

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 150 days.

(21) Appl. No.: 17/662,753

(22) Filed: May 10, 2022

(65) Prior Publication Data

US 2022/0383940 A1 Dec. 1, 2022

(30) Foreign Application Priority Data

May 26, 2021 (CN) .......................... 202110580294.X

(51) Int. Cl.
*G11C 11/4096* (2006.01)
*G11C 11/4091* (2006.01)
*G11C 11/4097* (2006.01)

(52) U.S. Cl.
CPC ...... *G11C 11/4096* (2013.01); *G11C 11/4091* (2013.01); *G11C 11/4097* (2013.01)

(58) Field of Classification Search
CPC ............ G11C 11/4096; G11C 11/4091; G11C 11/4097; G11C 11/4094; G11C 7/065; G11C 7/1069; G11C 7/02; G11C 2207/12; H10B 12/50; H01L 27/0207
See application file for complete search history.

(56) References Cited

U.S. PATENT DOCUMENTS

| 10,803,925 B2 | 10/2020 | Kim et al. | |
| 2017/0251152 A1* | 8/2017 | Shima | H04N 1/0308 |
| 2021/0288058 A1* | 9/2021 | Nishimura | H10B 41/10 |

FOREIGN PATENT DOCUMENTS

CN 108257631 A 7/2018

* cited by examiner

*Primary Examiner* — Sultana Begum
(74) *Attorney, Agent, or Firm* — Kilpatrick Townsend & Stockton LLP

(57) ABSTRACT

Embodiments of the present application provide a readout circuit layout structure, a readout circuit, and a memory layout structure. The readout circuit layout structure includes: a readout amplification module, a first processing module, and a second processing module arranged along a preset direction, wherein the readout amplification module is configured to read a voltage of a bit line, and the first processing module and the second processing module are at least configured to perform a noise cancellation on an output signal of the readout amplification module. The readout amplification module includes: a first NMOS region and a first PMOS region arranged close to the first processing module, and a second NMOS region and a second PMOS region arranged close to the second processing module, the first NMOS region, the first PMOS region, the second PMOS region, and the second NMOS region being arranged along the preset direction.

17 Claims, 11 Drawing Sheets

READOUT CIRCUIT LAYOUT STRUCTURE, READOUT CIRCUIT, AND MEMORY LAYOUT STRUCTURE

CROSS-REFERENCE TO RELATED APPLICATIONS

This application claims the priority of Chinese Patent Application No. 202110580294.X, submitted to the Chinese Intellectual Property Office on May 26, 2021, the disclosure of which is incorporated herein in its entirety by reference.

TECHNICAL FIELD

The present application relates to the field of semiconductor memory structure design, and in particular, to a readout circuit layout structure, a readout circuit, and a memory layout structure.

BACKGROUND

In a dynamic random access memory (DRAM), an operation of writing data into the memory is accomplished by storing charge into a capacitance of a memory cell, and an operation of reading data from the memory is accomplished by reading charge in the capacitance of the memory cell.

In the DRAM, the memory cell is connected to a bit line (BL) and a complementary bit line (BLB). During the data readout operation, a sense amplifier in the readout circuit is configured to read a voltage of the BL and a voltage of the BLB, and amplify a voltage difference between the BL and the BLB.

However, the applicant found that for the sense amplifier structure in the readout circuit, the mismatch between active region layouts in metal-oxide-silicon (MOS) transistors causes the problem of timing mismatch in the memory during the readout process.

SUMMARY

An embodiment of the present application provides a readout circuit layout structure, including: a readout amplification module, a first processing module, and a second processing module arranged along a preset direction, wherein the readout amplification module is configured to read a voltage of a bit line, and the first processing module and the second processing module are at least configured to perform a noise cancellation on an output signal of the readout amplification module; the readout amplification module includes: a first NMOS region and a first PMOS region arranged close to the first processing module, and a second NMOS region and a second PMOS region arranged close to the second processing module, the first NMOS region, the first PMOS region, the second PMOS region, and the second NMOS region being arranged along the preset direction; an active pattern of the first NMOS region and an active pattern of the second NMOS region are independent of each other, and an active pattern of the first PMOS region and an active pattern of the second PMOS region are independent of each other.

An embodiment of the present application further provides a memory layout structure, including a plurality of the readout circuit layout structures described above, wherein the plurality of the readout circuit layout structures are sequentially arranged along a direction perpendicular to the preset direction, two adjacent readout circuit layout structures form a readout circuit layout structure set, the readout circuit layout structure set shares a active pattern, and adjacent readout circuit layout structure sets are spaced apart by an equal distance.

An embodiment of the present application further provides a readout circuit, including: a readout amplifier, a first processing circuit, and a second processing circuit are arranged along a preset direction, wherein the readout amplifier is configured to read a voltage of a bit line, and the first processing circuit and the second processing circuit are at least configured to perform a noise cancellation on an output signal of the readout amplifier; the readout amplifier comprises: a first NMOS transistor and a first PMOS transistor arranged close to the first processing circuit, and a second NMOS transistor and a second PMOS transistor arranged close to the second processing circuit, the first processing circuit, the first NMOS transistor, the first PMOS transistor, the second processing circuit, the second NMOS transistor, and the second PMOS transistor being arranged along the preset direction; an active layer of the first NMOS transistor and an active layer of the second NMOS transistor are independent of each other, and an active layer of the first PMOS transistor and an active layer of the second PMOS transistor are independent of each other.

DETAILED DESCRIPTION

Figure 1:
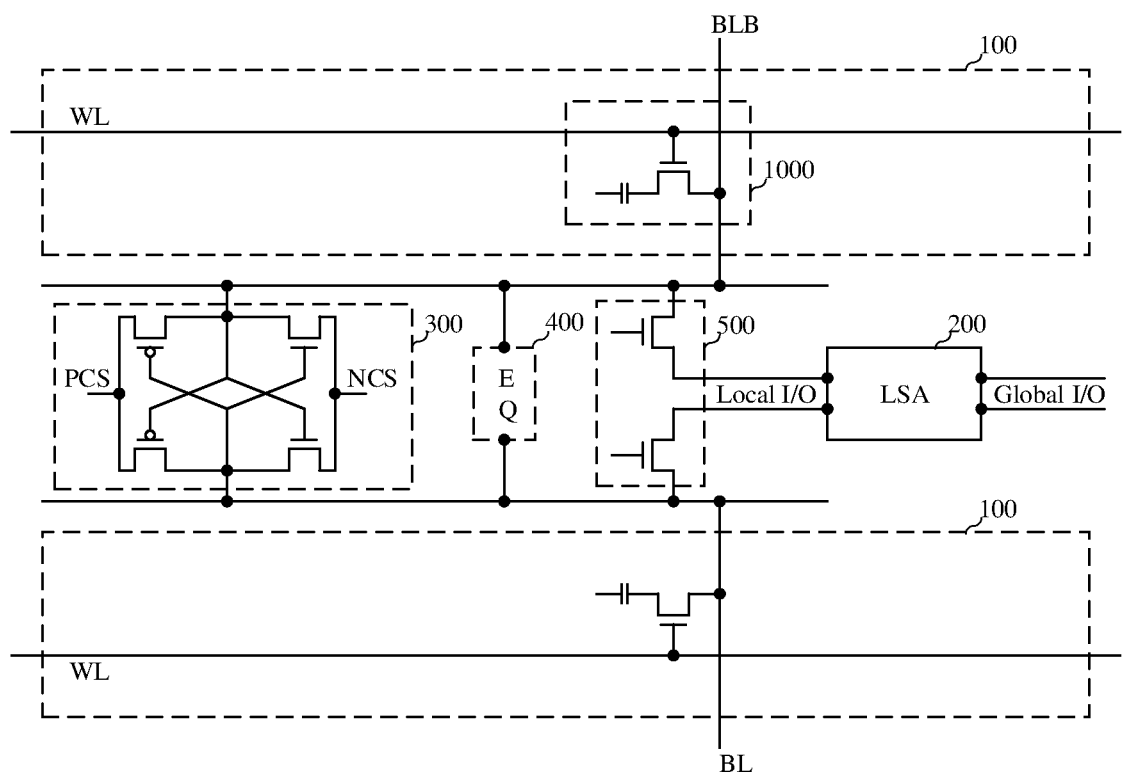
FIG. 1 is a schematic structural diagram of a memory.

Referring to FIG. 1, in the structure of a memory, each memory array 100 includes a plurality of memory cells 1000, where each memory cell 1000 is a 1T1C (1 transistor 1 capacitance) structure consisting of an element transistor and an element capacitance. A read/write switching circuit 200, a readout circuit 300, an equalization circuit 400, and an input/output circuit 500 are arranged between adjacent memory arrays.

One of a source or drain of the element transistor is connected to the element capacitance, and the other is connected to a bit line BL/complementary bit line BLB. A word line WL is connected to a gate of the element transistor, and is configured to selectively turn on the gate of the corresponding element transistor; the element capacitance is connected to the bit line BL/complementary bit line BLB, so that an electrical signal in the bit line BL/complementary bit line BLB is written into the element capacitance, or an electrical signal in the element capacitance is read out to the bit line BL/complementary bit line BLB.

The equalization circuit 400 is connected to the bit line BL and the complementary bit line BLB, and is configured to equalize voltages between the bit line BL and the complementary bit line BLB in a precharge phase.

The input/output circuit 500 includes: an input/output transistor, where one is of a source or drain of the input/ output transistor is connected to the bit line BL/complementary bit line BLB, and the other is connected to a local data line Local I/O; a gate of the input/output transistor is configured to receive a selection signal, and according to the selection signal, choose to turn on the bit line BL/complementary bit line BLB corresponding to the selection signal, so that the bit line BL/complementary bit line BLB is connected to the local data line Local I/O, thereby implementing data transfer between the bit line BL/complementary bit line BLB and the local data line Local I/O.

The local data line Local I/O is connected to a global data line Global I/O through the read/write switching circuit 200, to transmit external data or data in a local sense amplifier (which is disposed in the read/write switching circuit 200) to the local data line Local I/O, or output data in the local data line Local I/O to the global data line Global I/O.

The readout circuit 300 is connected between the bit line BL and the complementary bit line BLB. When an electrical signal in the element capacitance is read out to the bit line BL/complementary bit line BLB, since the element capacitance and the bit line BL/complementary bit line BLB share a charge, a voltage of the bit line BL/complementary bit line BLB is increased or decreased by a voltage variation $\Delta V$ through a precharge voltage. The readout circuit 300 is configured to read and amplify the voltage variation $\Delta V$ between the bit line BL and the complementary bit line BLB in response to a first control signal PCS and a second control signal NCS.

Figure 2:
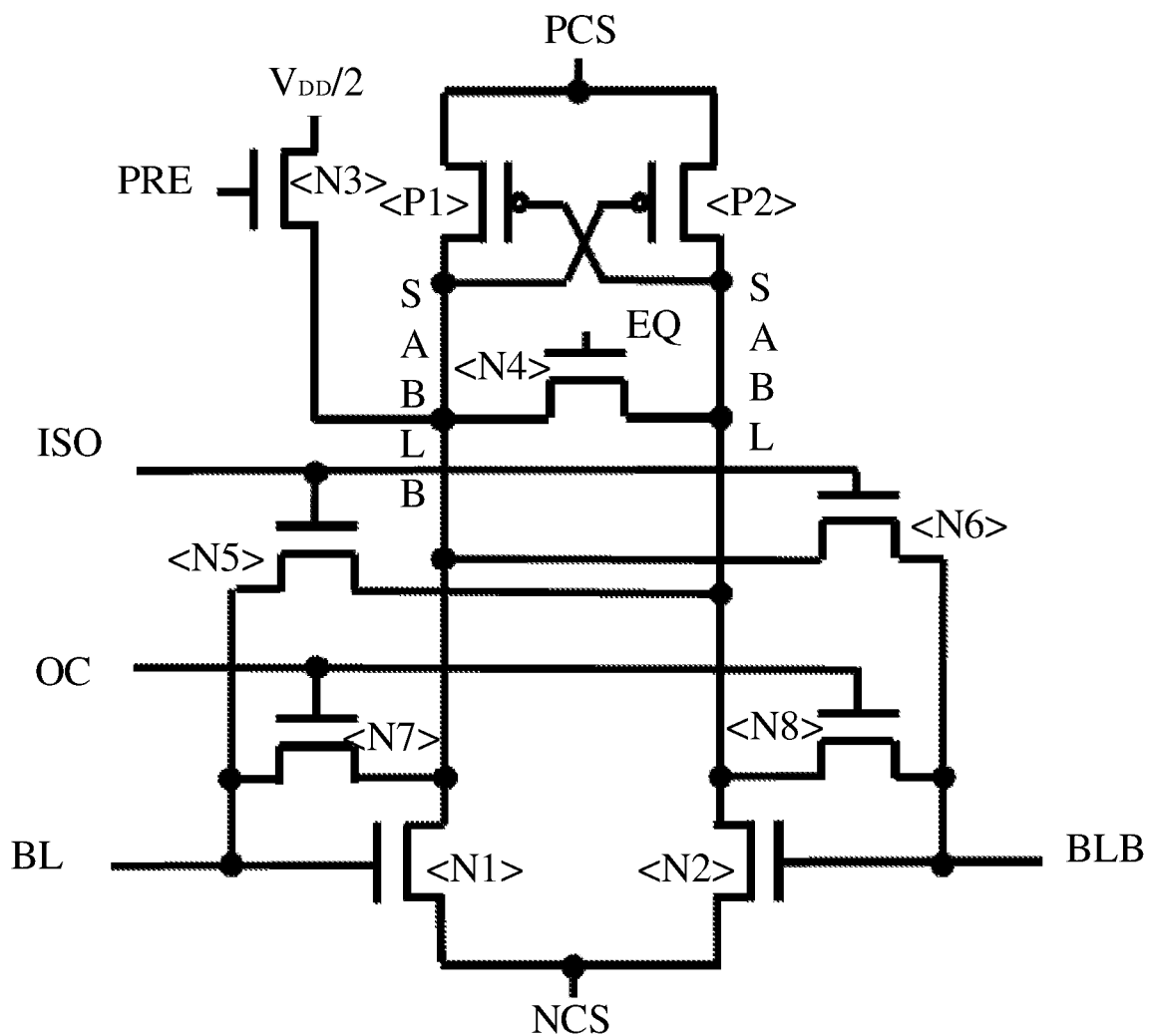
FIG. 2 is a circuit schematic diagram of a readout circuit.

Specifically, referring to FIG. 2, the readout circuit 300 (referring to FIG. 1) includes: a first PMOS transistor <P1>, a second PMOS transistor <P2>, a first NMOS transistor <N1>, and a second NMOS transistor <N2>. One of a source or drain of the first PMOS transistor <P1> is connected to a complementary readout bit line SABLB, while the other is configured to receive a first control signal PCS, and a gate of the first PMOS transistor <P1> is connected to a readout bit line SABL. One of a source or drain of the second PMOS transistor <P2> is connected to the readout bit line SABL, while the other is configured to receive the first control signal PCS, and a gate of the second PMOS transistor <P2> is connected to the complementary readout bit line SABLB. One of a source or drain of the first NMOS transistor <N1> is connected to the complementary readout bit line SABLB, while the other is configured to receive a second control signal NCS, and a gate of the first NMOS transistor <N1> is connected to a bit line BL. One of a source or drain of the second NMOS transistor <N2> is connected to a readout bit line BLB, while the other is configured to receive the second control signal NCS, and a gate of the second NMOS transistor <N2> is connected to the complementary readout bit line SABLB.

The readout circuit 300 in FIG. 2 is further configured to cancel noise. That is, the readout circuit 300 further includes: a first isolation MOS transistor <N5>, a second isolation MOS transistor <N6>, a first offset cancellation MOS transistor <N7>, and a second offset cancellation MOS transistor <N8>. One of a source or drain of the first isolation MOS transistor <N5> is connected to the bit line BL, while the other is connected to the readout bit line SABL, and a gate of the first isolation MOS transistor <N5> is configured to receive an isolation signal (ISO), and connect the bit line BL and the readout bit line SABL in response to the isolation signal ISO, or isolate the bit line BL from the readout bit line SABL in response to the isolation signal ISO. One of a source or drain of the second isolation MOS transistor <N6> is connected to the complementary bit line BLB, while the other is connected to the complementary readout bit line SABLB, and a gate of the second isolation MOS transistor <N6> is configured to receive the isolation signal ISO, and connect the complementary bit line BLB and the complementary readout bit line SABLB in response to the isolation signal ISO, or isolate the complementary bit line BLB from the complementary readout bit line SABLB in response to the isolation signal ISO. One of a source or drain of the first offset cancellation MOS transistor <N7> is connected to the bit line BL, while the other is connected to the complementary readout bit line SABLB, and a gate of the first offset cancellation MOS transistor <N7> is configured to receive an offset cancelling signal (OC), and connect the bit line BL and the complementary readout bit line SABLB in response to the offset cancelling signal OC, or disconnect the bit line BL from the complementary readout bit line SABLB in response to the offset cancelling signal OC. One of a source or drain of the second offset cancellation MOS transistor <N8> is connected to the complementary bit line BLB, and the other is connected to the readout bit line SABL, and a gate of the second offset cancellation MOS transistor <N8> is configured to receive the offset cancelling signal OC, and connect the complementary bit line BLB and the readout bit line SABL in response to the offset cancelling signal OC, or disconnect the complementary bit line BLB from the readout bit line SABL in response to the offset cancelling signal OC.

The precharge is implemented by the precharge transistor <N3>. The equalization circuit 400 is implemented by the equalization transistor <N4>. One of a source or drain of the precharge transistor <N3> is configured to receive a precharge voltage VDD/2, while the other is configured to be connected to one of a source or drain of the equalization transistor <N4>, and a gate of the precharge transistor <N3> is configured to receive a precharge signal PRE, and precharge the readout bit line SABL and the complementary readout bit line SABLB in response to the precharge signal PRE. One of a source or drain of the equalization transistor <N4> is connected to the readout bit line SABL, while the other is connected to the complementary readout bit line SABLB, and a gate of the equalization transistor <N4> is configured to receive an equalization signal EQ, and equalize voltages of the readout bit line SABL and the complementary readout bit line SABLB in response to the equalization signal EQ.

Figure 3:
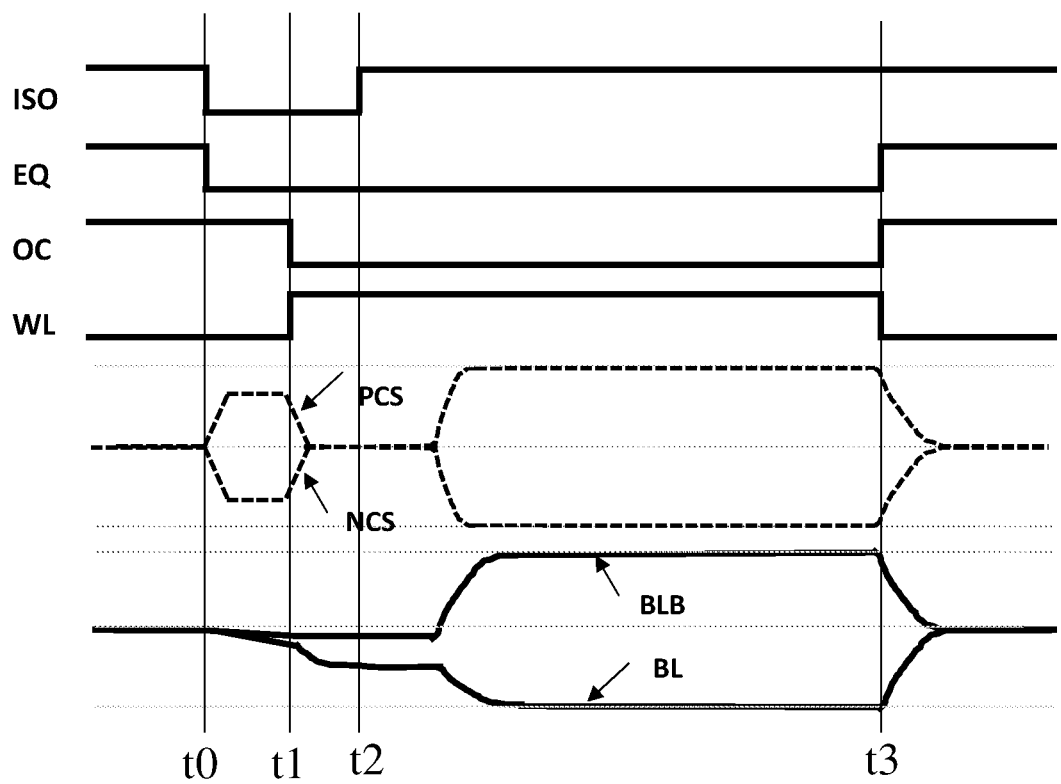
FIG. 3 is a schematic sequence diagram of a readout circuit.

Referring to FIG. 3, the data readout process includes 5 phases: phase 1 is a phase from t to t0, in which a precharge operation is performed; phase 2 is a phase from t0 to t1, in which an offset cancellation operation is performed; phase 3 is a phase from t1 to t2, in which a charge sharing operation is is performed; phase 4 is a phase from t2 to t3, in which a pre-readout operation is performed; and phase 5 is a phase from t3 to t, in which a restoration operation is performed.

Specifically, in the process of phase 1, the precharge transistor <N3> responds to a logic-high (H) precharge signal PRE, the equalization transistor <N4> responds to a logic-high (H) equalization signal EQ, the first isolation MOS transistor <N5> and the second isolation MOS transistor <N6> respond to a logic-high (H) isolation signal ISO, and the first offset cancellation MOS transistor <N7> and the second offset cancellation MOS transistor <N8> respond to a logic-high (H) offset cancelling signal OC. The bit line BL, the complementary bit line BLB, the readout bit line SABL, and the complementary readout bit line SABLB are all connected to the precharge voltage VDD/2, and the first control signal PCS and the second control signal NCS are also charged to the precharge voltage VDD/2. In the process of phase 2, the precharge signal PRE and the equalization signal EQ are at low levels; the first isolation MOS transistor <N5> and the second isolation MOS transistor <N6> respond to a logic-low (L) isolation signal ISO, and the first offset cancellation MOS transistor <N7> and the second offset cancellation MOS transistor <N8> respond to the logic-high (H) offset cancelling signal OC; the first control signal PCS switches from the precharge voltage VDD/2 to an internal power voltage VDD, and the second control signal NCS switches from the precharge voltage VDD/2 to a ground voltage VSS. In the process of phase 3, the first isolation MOS transistor <N5> and the second isolation MOS transistor <N6> respond to the logic-high (H) isolation signal ISO, the first offset cancellation MOS transistor <N7> and the second offset cancellation MOS transistor <N8> respond to a logic-low (L) offset cancelling signal OC, and the word line WL is activated. In this case, a charge is shared between a selected bit line BL/complementary bit line BLB and the element capacitance, and the first control signal PCS and the second control signal NCS become the precharge voltage VDD/2. In the process of phase 4, when data with a value of "1" is stored in the memory cell, in the pre-readout operation phase, the voltage on the readout bit line SABL can be increased to the internal power voltage VDD, and the voltage on the complementary readout bit line SABLB can be reduced to the ground voltage VSS. When an output with a value of "0" is stored in the memory cell, in the pre-readout operation phase, the voltage on the readout bit line SABL can be reduced to the ground voltage VSS, and the voltage on the complementary readout bit line SABLB can be increased to the internal power voltage VDD. In the process of phase 5, the first isolation MOS transistor <N5> and the second isolation MOS transistor <N6> respond to the logic-high (H) isolation signal ISO, and the first offset cancellation MOS transistor <N7> and the second offset cancellation MOS transistor <N8> respond to the logic-high (H) offset cancelling signal OC; the bit line BL, the complementary bit line BLB, the readout bit line SABL, and the complementary readout bit line SABLB are all connected to the precharge voltage VDD/2, and the first control signal PCS and the second control signal NCS are also charged to the precharge voltage VDD/2.

Figure 4:
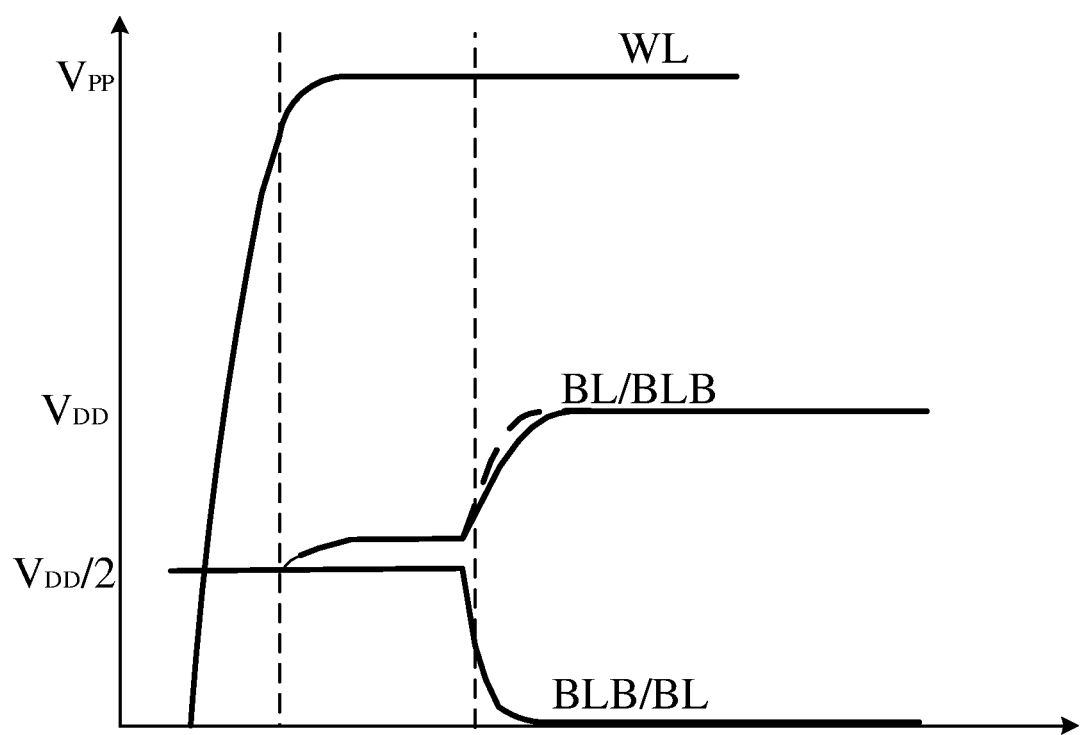
FIG. 4 is a schematic diagram of signals in a bit line BL/complementary bit line BLB in a case of MOS transistor mismatch in a sense amplifier in a readout circuit.

In the process of phase 4, different ambient device environments of MOS transistors in a sense amplifier may cause the MOS transistors in the same sense amplifier to have different device characteristics, while the device characteristics of the MOS transistors in the same sense amplifier are required to match each other. Therefore, MOS transistors with different device characteristics will affect an amplification capacity of the sense amplifier, thus reducing the DRAM performance. Referring to FIG. 4, due to the inconsistent device characteristics of the transistors, the voltage of the bit line BL/complementary bit line BLB that should have risen according to the dashed line is deviated in certain degree, resulting in timing mismatch of the memory in the readout process.

To solve the foregoing problem, an embodiment of the present application provides a readout circuit layout structure, including: a readout amplification module, a first processing module, and a second processing module arranged along a preset direction, where the readout amplification module is configured to read a voltage of a bit line, and the first processing module and the second processing module are at least configured to perform noise cancellation on an output signal of the readout amplification module; the readout amplification module includes: a first NMOS region and a first PMOS region arranged close to the first processing module, and a second NMOS region and a second PMOS region arranged close to the second processing module, the first NMOS region, the first PMOS region, the second PMOS region, and the second NMOS region being arranged along the preset direction; an active pattern of the first NMOS region and an active pattern of the second NMOS region are independent of each other, and an active pattern of the first PMOS region and an active pattern of the second PMOS region are independent of each other.

In order to make the objectives, technical solutions and advantages of the embodiments of the present application clearer, the embodiments of the present application are described below with reference to the accompanying drawings. Those of ordinary skill in the art should understand that many technical details are proposed in each embodiment of the present application to help the reader better understand the present application. However, even without these technical details and various changes and modifications made based on the following embodiments, the technical solutions claimed in the present application may still be realized. The following divisions of the various embodiments are intended for convenience of description, and are not intended to constitute any limitation to the specific implementation of the present application. The various embodiments may be combined with each other and cross-referenced in case of no contradiction.

FIG. 5 to FIG. 10 are schematic structural diagrams of a readout circuit layout structure according to an embodiment of the present application. The readout circuit layout structure provided by this embodiment is further described in detail below with reference to the accompanying drawings.

Figure 5:
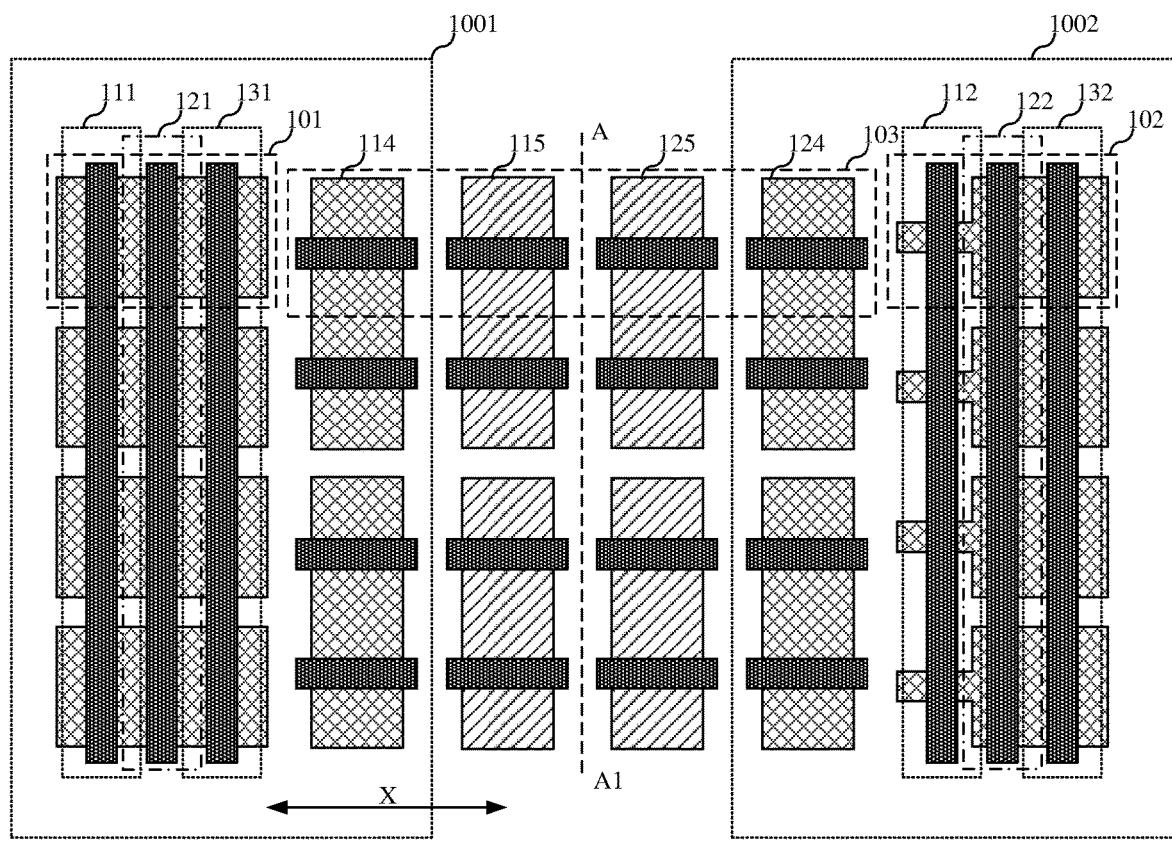
FIG. 5 to FIG. 10 are schematic structural diagrams of a readout circuit layout structure according to an embodiment of the present application.

Referring to FIG. 5, the readout circuit layout structure includes:

a readout amplification module 103, a first processing module 101, and a second processing module 102 arranged along a preset direction.

The preset direction is direction X shown in the figure (which corresponds to the arrangement direction of the plurality of memory arrays 100 in FIG. 1). The readout amplification module 103 is configured to read a voltage of a bit line BL, to form a sense amplifier subsequently. The first processing module 101 and the second processing module 102 are at least configured to perform noise cancellation on an output signal of the readout amplification module 103, to form a readout circuit 300 shown in FIG. 2 with the sense amplifier subsequently.

Specifically, the readout amplification module 103 includes: a first NMOS region 114 and a first PMOS region 115 arranged close to the first processing module 101, and a second NMOS region 124 and a second PMOS region 125 arranged close to the second processing module 102.

The first NMOS region 114, the first PMOS region 115, the second NMOS region 124, and the second PMOS region 125 are arranged along the preset direction. That is, the first NMOS region 114, the first PMOS region 115, the second NMOS region 124, and the second PMOS region 125 are arranged in direction X.

More specifically, an active pattern of the first NMOS region 114 and an active pattern of the second NMOS region 124 are independent of each other; an active pattern of the first PMOS region 115 and an active pattern of the second PMOS region 125 are independent of each other. The active patterns of the two NMOS regions are independent of each other, and the active patterns of the two PMOS regions are independent of each other, so that active regions of MOS transistor structures in the subsequently formed sense amplifier are independent of each other, which can reduce the signal interference caused by a shared active region in MOS transistors.

In addition, in this embodiment, the active pattern of the first NMOS region 114 and the active pattern of the second NMOS region 124 are symmetrical to each other; the active pattern of the first PMOS region 115 and the active pattern of the second PMOS region 125 are symmetrical to each other. MOS transistors in the same sense amplifier are arranged symmetrically, to ensure consistent environments of the MOS transistors that need to be matched in the same sense amplifier, thereby balancing device characteristics of the MOS transistors in the same sense amplifier and improving the stability of the memory.

Specifically, referring to FIG. 5 to FIG. 10, the active pattern of the first NMOS region 114 and the active pattern of the second NMOS region 124 are symmetrical to each other about an axis of symmetry AA1; the active pattern of the first PMOS region 115 and the active pattern of the second PMOS region 125 are also symmetrical to each other about the axis of symmetry AA1.

In addition, for the first NMOS region 114, the second NMOS region 124, the first PMOS region 115, and the second PMOS region 125, a gate pattern of the first NMOS region 114, a gate pattern of the second NMOS region 124, a gate pattern of the first PMOS region 115, and a gate pattern of the second PMOS region 125 are arranged along the preset direction. That is, the gate pattern of the first NMOS region 114, the gate pattern of the second NMOS region 124, the gate pattern of the first PMOS region 115, and the gate pattern of the second PMOS region 125 are arranged direction X.

It should be noted that, in this embodiment, a length of the active pattern of the first NMOS region 114 and a length of the active pattern of the second NMOS region 124 are greater than a length of the active pattern of the first PMOS region 115 and a length of the active pattern of the second PMOS region 125. The active pattern of the NMOS region is wider than the active pattern of the PMOS region, to provide a more powerful drive capacity. In other embodiments, it is also feasible to set the size of the active pattern of the PMOS region to be larger than that of the active pattern of the NMOS region, or set the size of the active pattern of the PMOS region to be the same as that of the active pattern of the NMOS region.

Correspondingly, in this embodiment, a position of an active pattern of the first processing module 101 and a position of an active pattern of the second processing module 102 are symmetrical to each other. The position of the first processing module 101 and the position of the second processing module 102 in the same sense amplifier are arranged symmetrically, to further ensure consistent environments of the MOS transistors that need to be matched in the same sense amplifier, thereby improving the stability of the memory.

Specifically, referring to FIG. 5 to FIG. 10, the position of the active pattern of the first processing module 101 and the position of the active pattern of the second processing module 102 are symmetrical to each other about the axis of symmetry AA1. That is, each position in the active pattern of the first processing module 101 and the corresponding position in the active pattern of the second processing module 102 are at equal distances to the axis of symmetry AA1.

It should be noted that, in this embodiment, the active pattern of the first processing module 101 and the active pattern of the second processing module 102 have different structures. Therefore, the foregoing expression that "a position of an active pattern of the first processing module 101 and a position of an active pattern of the second processing module 102 are symmetrical to each other" is adopted. In other embodiments, if the active pattern of the first processing module and the active pattern of the second processing module have the same structure, the active pattern of the first processing module and the active pattern of the second processing module may be symmetrical to each other.

Further referring to FIG. 5 to FIG. 10, for the first processing module 101, the first processing module 101 includes a first offset cancellation region 111, a first isolation region 121, and an equalization region 131. The first offset cancellation region 111 connects the bit line BL to a complementary readout bit line SABLB, the first isolation region 121 is configured to connect the bit line BL to a readout bit line SABL, and the equalization region 131 is configured to connect the readout bit line SABL to the complementary readout bit line SABLB.

With reference to FIG. 2, the first offset cancellation region 111 is configured to form a first offset cancellation MOS transistor <N7> subsequently; the first isolation region 121 is configured to form a first isolation MOS transistor <N5> subsequently, and the equalization region 131 is configured to form an equalization MOS transistor <N4> subsequently. The first offset cancellation region 111 and the first isolation region 121 share a source, and the shared source is connected to the bit line BL; the first isolation region 121 and the equalization region 131 share a drain, and the shared drain is connected to the readout bit line SABL; a drain of the first offset cancellation region 111 and a source of the equalization region 131 are connected to the complementary readout bit line SABLB.

The second processing module 102 includes a precharge region 112, a second isolation region 122, and a second offset cancellation region 132. The precharge region 112 is configured to precharge the bit line BL and the complementary bit line BLB based on a precharge instruction. The second isolation region 122 is configured to connect the complementary bit line BLB to the complementary readout bit line SABLB. The second offset cancellation region 132 is configured to connect the complementary bit line BLB to the readout bit line SABL.

With reference to FIG. 2, the precharge region 112 is configured to form a precharge MOS transistor <N3> subsequently, the second isolation region 122 is configured to form a second isolation MOS transistor <N6> subsequently, and the second offset cancellation region 132 is configured to form a second offset cancellation MOS transistor <N8> subsequently. The precharge region 112 and the second isolation region 122 share a source, and the shared source is connected to the complementary readout bit line SABLB. The second isolation region 122 and the second offset cancellation region 132 share a drain, and the shared drain is connected to the complementary bit line BLB. A drain of the precharge region 112 is configured to receive a precharge voltage VDD, and a source of the second isolation region 132 is connected to the readout bit line SABL.

It should be noted that, in this embodiment, the determined "source" and "drain" are examples for description of the present application, to help those skilled in the art to understand the arrangement of this embodiment, but are not intended to limit this embodiment. In other embodiments, the "source" and "drain" determined in the present application are interchangeable.

The active pattern of the first offset cancellation region 111, the active pattern of the first isolation region 121, and the active pattern of the equalization region 131 are interconnected. That is, the active pattern of the first offset cancellation region 111, the active pattern of the first isolation region 121, and the active pattern of the equalization region 131 are set as the same active pattern. The active pattern of the precharge region 112, the active pattern of the second isolation region 122, and the active pattern of the second offset cancellation region 132 are interconnected. That is, the active pattern of the precharge region 112, the active pattern of the second isolation region 122 and the active pattern of the second offset cancellation region 132 are set as the same active pattern.

As mentioned above, in this embodiment, the position of the active pattern of the first processing module 101 and the position of the active pattern of the second processing module 102 are symmetrical to each other about the axis of symmetry AA1. Specifically, the active pattern of the first offset cancellation region 111 and the active pattern of the second offset cancellation region 132 are symmetrical to each other about the axis of symmetry AA1; the active pattern of the first isolation region 121 and the active pattern of the second isolation region 122 are symmetrical to each other about the axis of symmetry AA1; the position of the active pattern of the equalization region 131 and the position of the active pattern of the precharge region 112 are symmetrical to each other about the axis of symmetry AA1.

In addition, for the first processing module 101 and the second processing module 102 in this embodiment, a gate pattern of the first processing module 101 and a gate pattern of the second processing module 102 are arranged along a direction perpendicular to the preset direction. That is, the gate pattern of the first processing module 101 and the gate pattern of the second processing module 102 are arranged perpendicular to direction X.

Figure 6:
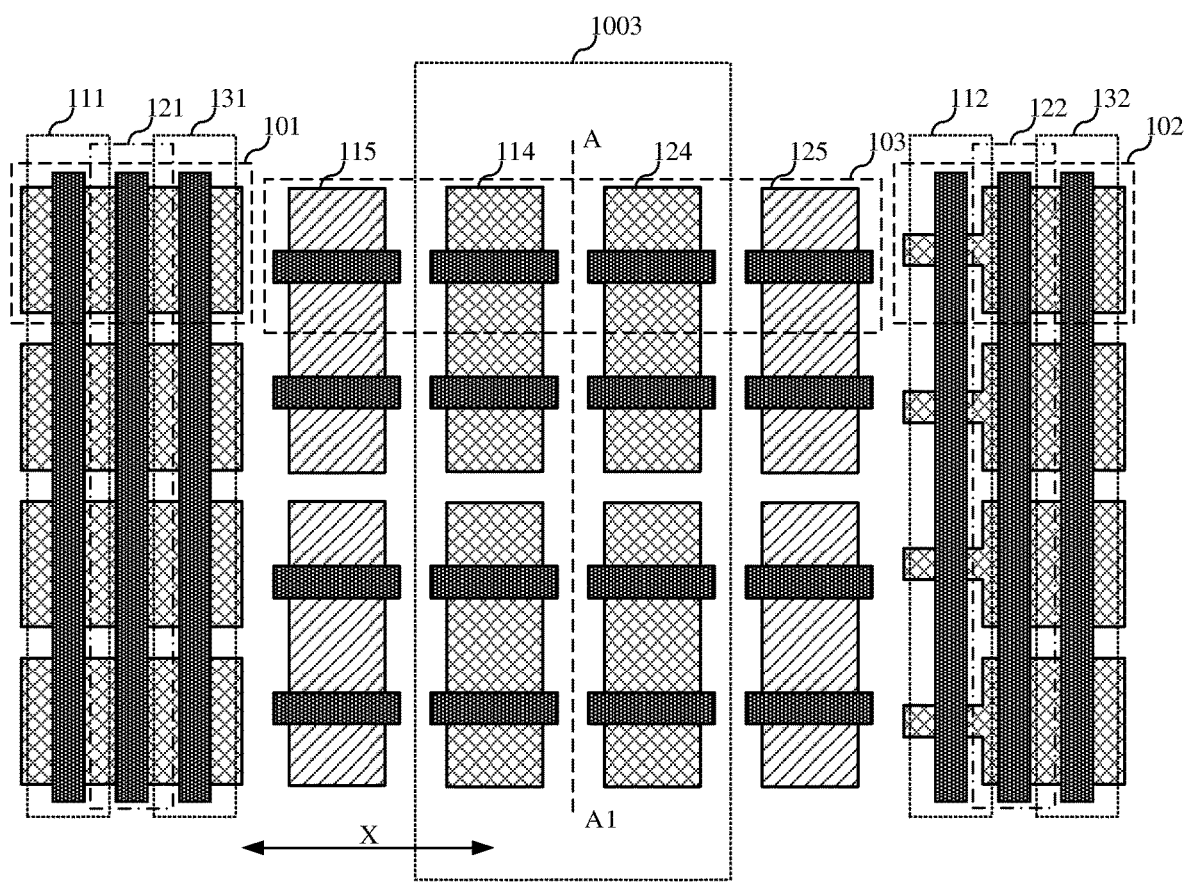

This embodiment provides six types of arrangements of the first processing module 101, the second processing module 102, and the readout amplification module 103, which are specifically as follows:

Referring to FIG. 5 and FIG. 6, the active pattern of the first processing module 101 is arranged at a side, which is away from the active pattern of the second processing module 102, of the active pattern of the first NMOS region 114 and the active pattern of the first PMOS region 115; the active pattern of the second processing module 102 is arranged at a side, which is away from the active region of the first processing module 101, of the active pattern of the second NMOS region 124 and the active pattern of the second PMOS region 125. That is, the first processing module 101 and the second processing module 102 are arranged at two sides of the readout amplification module 103.

In a specific example, referring to FIG. 5, in the preset direction, the active pattern of the first PMOS region 115 is arranged at a side, which is close to the active pattern of the second processing module 102, of the active pattern of the first NMOS region 114; the active pattern of the first processing module 101 is arranged at a side, which is away from the active pattern of the second processing module 102, of the active pattern of the first NMOS region 114; the active pattern of the second PMOS region 125 is arranged at a side, which is close to the active pattern of the first processing module 101, of the active pattern of the second NMOS region 124; the active pattern of the second processing module 102 is arranged at a side, which is away from the active pattern of the first processing module 101, of the active pattern of the second NMOS region 124.

The active pattern of the first processing module 101 and the active pattern of the first NMOS region 114 are arranged in a same well region; the active pattern of the second processing module 102 and the active pattern of the second NMOS region 124 are arranged in a same well region. As shown in FIG. 5, the active pattern of the first processing module 101 and the active pattern of the first NMOS region 114 are arranged in a first well region 1001; the active pattern of the second processing module 102 and the active pattern of the second NMOS region 124 are arranged in a second well region 1002. Active patterns arranged in the same well region can ensure the same ion implantation characteristics, so that the active pattern of the first processing module 101 and the active pattern of the first NMOS region have the same ion implantation characteristics, and the active pattern of the second processing module 102 and the active pattern of the second NMOS region 124 have the same ion implantation characteristics, to further balance device characteristics of the MOS transistors in the same sense amplifier.

In another specific example, referring to FIG. 6, in the preset direction, the active pattern of the first NMOS region 114 is arranged at a side, which is close to the active pattern of the second processing module 102, of the active pattern of the first PMOS region 115; the active pattern of the first processing module 101 is arranged at a side, which is away from the active pattern of the second processing module 102, of the active pattern of the first PMOS region 115; the active pattern of the second NMOS region 124 is arranged at a side, which is close to the active pattern first processing module 101, of the active pattern of the second PMOS region 125; the active pattern of the second processing module 102 is arranged at a side, which is away from the active pattern of the first processing module 101, of the active pattern of the second PMOS region 125.

The active pattern of the first NMOS region 114 and the active pattern of the second NMOS region 124 are arranged in a same well region. As shown in FIG. 6, the active pattern of the first NMOS region 114 and the active pattern of the second NMOS region 124 are arranged in a third well region 1003.

Figure 7:
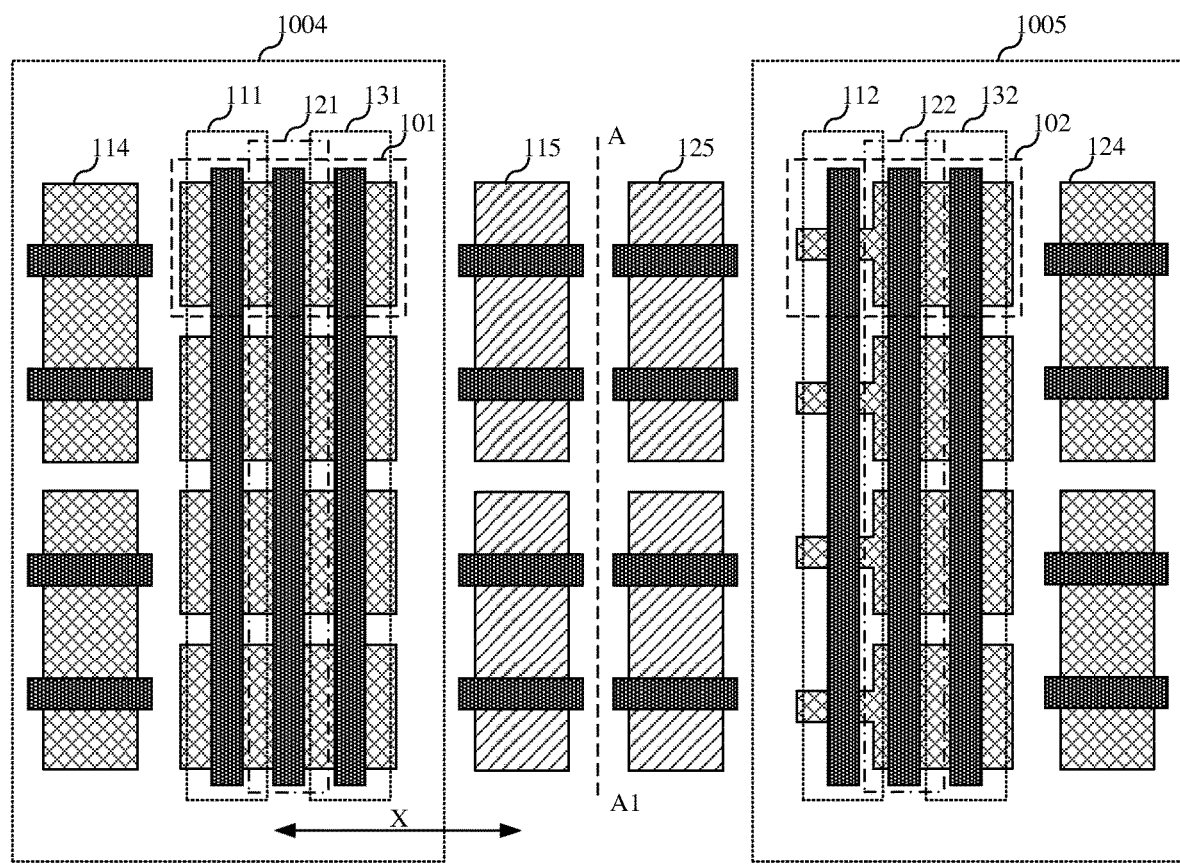
Figure 8:
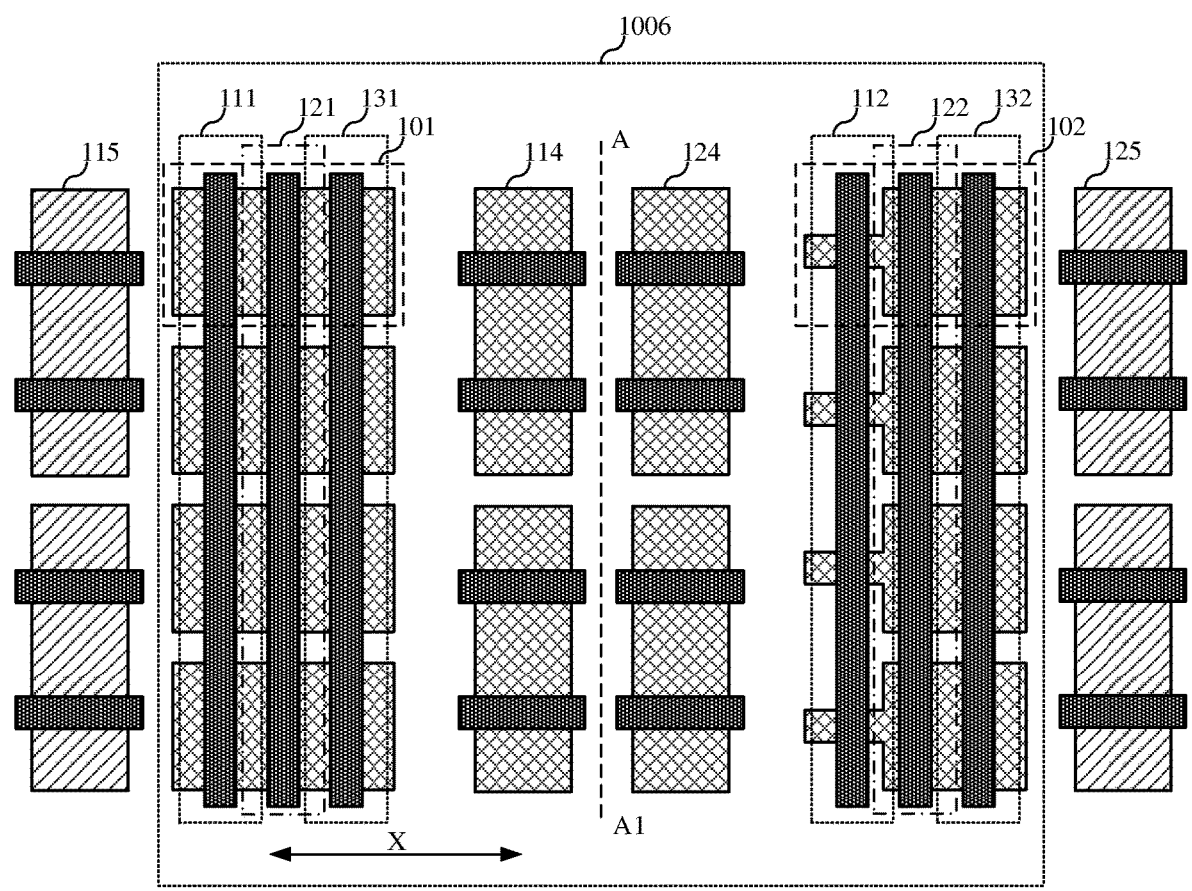

Referring to FIG. 7 and FIG. 8, the active pattern of the first processing module 101 is arranged between the active pattern of the first NMOS region 114 and the active pattern of the first PMOS region 115; the active pattern of the second processing module 102 is arranged between the active pattern of the second NMOS region 124 and the active pattern of the second PMOS region 125. That is, the first processing module 101 and the second processing module 102 are arranged in the readout amplification module 103.

In a specific example, referring to FIG. 7, in the preset direction, the active pattern of the first NMOS region 114 is arranged at a side, which is away from the active pattern of the second processing module 102, of the active pattern of the first processing module 101; the active pattern of the second NMOS region 124 is arranged at a side, which is away from the active pattern of the first processing module 101, of the active pattern of the second processing module 102; the active pattern of the first PMOS region 115 and the active pattern of the second PMOS region 125 are arranged between the active pattern of the first processing module 101 and the active pattern of the second processing module 102.

The active pattern of the first processing module 101 and the active pattern of the first NMOS region 114 are arranged in a same well region; the active pattern of the second processing module 102 and the active pattern of the second NMOS region 124 are arranged in a same well region. As shown in FIG. 7, the active pattern of the first processing module 101 and the active pattern of the first NMOS region 114 are arranged in a fourth well region 1004; the active pattern of the second processing module 102 and the active pattern of the second NMOS region 124 are arranged in a fifth well region 1005.

In another specific example, referring to FIG. 8, in the preset direction, the active pattern of the first PMOS region 115 is arranged at a side, which is away from the active pattern of the second processing module 102, of the active pattern of the first processing module 101; the active pattern of the second PMOS region 125 is arranged at a side, which is away from the active pattern of the first processing module 101, of the active pattern of the second processing module 102; the active pattern of the first NMOS region 114 and the active pattern of the second NMOS region 124 are arranged between the active pattern of the first processing module 101 and the active pattern of the second processing module 102.

The active pattern of the first processing module 101, the active pattern of the first NMOS region 114, the active pattern of the second processing module 102, and the active pattern of the second NMOS region 124 are arranged in a same well region. As shown in FIG. 8, the active pattern of the first processing module 101, the active pattern of the first NMOS region 114, the active pattern of the second processing module 102, and the active pattern of the second NMOS region 124 are arranged in a sixth well region 1006. Active patterns arranged in the same well region can ensure the same ion implantation characteristics, so that the active pattern of the first processing module 101, the active pattern of the first NMOS region 114, the active pattern of the second processing module 102, and the active pattern of the second NMOS region 124 have the same ion implantation characteristics, to further balance device characteristics of the MOS transistors in the same sense amplifier.

Figure 9:
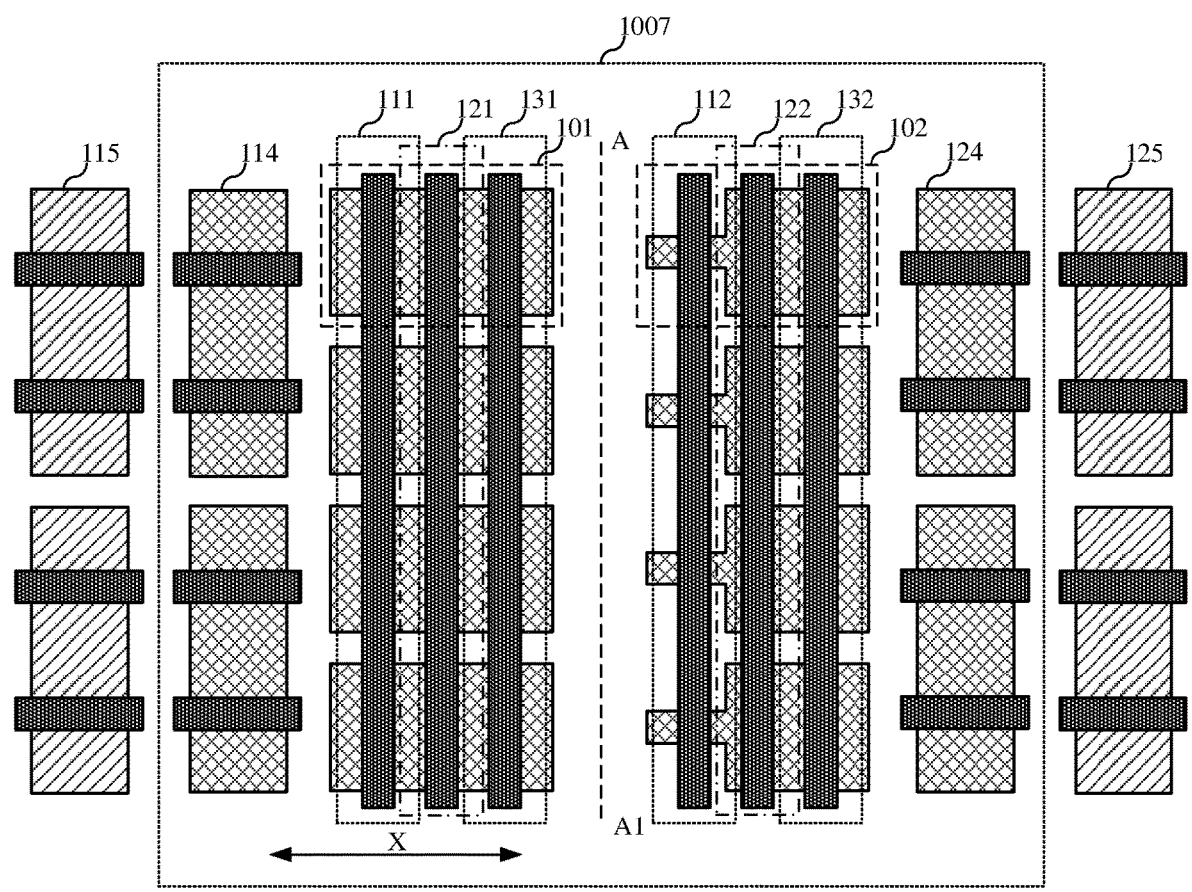
Figure 10:
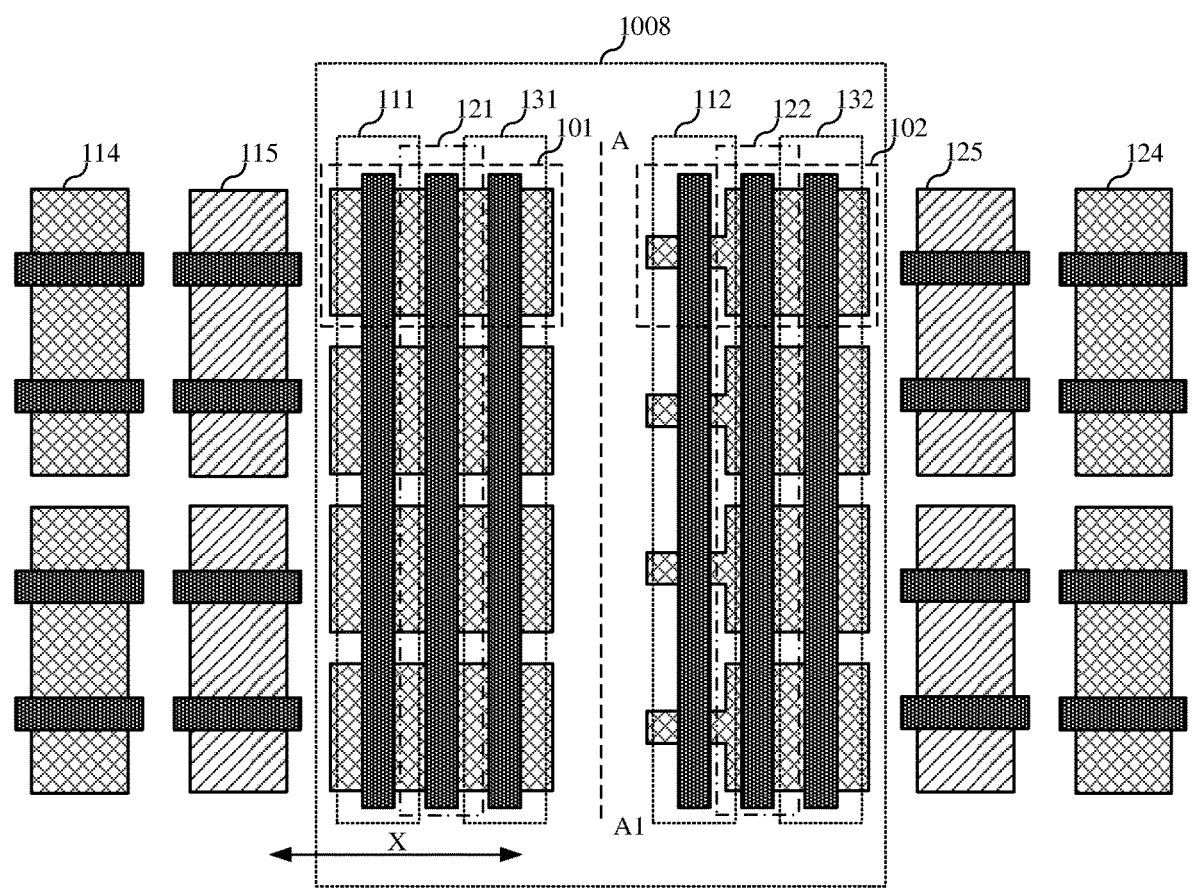

Referring to FIG. 9 and FIG. 10, in the preset direction, the active pattern of the first processing module 101 is arranged at a side, which is close to the second processing module 102, of the active pattern of the first NMOS region 114 and the active pattern of the first PMOS region 115; the active pattern of the second processing module 102 is arranged at a side, which is close to the first processing module 101, of the active pattern of the second NMOS region 124 and the active pattern of the second PMOS region 125. That is, the first processing module 101 and the second processing module 102 are arranged in the readout amplification modules 103.

In a specific example, referring to FIG. 9, in the preset direction, the active pattern of the first PMOS region 115 is arranged at a side, which is away from the active pattern of the second processing module 102, of the active pattern of the first NMOS region 114; the active pattern of the first processing module 101 is arranged at a side, which is close to the active pattern of the second processing module 102, of the active pattern of the first NMOS region 114; the active pattern of the second PMOS region 125 is arranged at a side, which is away from the active pattern of the first processing module 101, of the active pattern of the second NMOS region 124; the active pattern of the second processing module 102 is arranged at a side, which is away from the active pattern of the first processing module 101, of the active pattern of the second NMOS region 124.

The active pattern of the first processing module 101, the active pattern of the first NMOS region 114, the active pattern of the second processing module 102, and the active pattern of the second NMOS region 124 are arranged in a same well region. As shown in FIG. 9, the active pattern of the first processing module 101, the active pattern of the first NMOS region 114, the active pattern of the second processing module 102, and the active pattern of the second NMOS region 124 are arranged in a same seventh well region 1007.

In another specific example, referring to FIG. 10, in the preset direction, the active pattern of the first NMOS region 114 is arranged at a side, which is away from the active pattern of the second processing module 102, of the active pattern of the first PMOS region 115; the active pattern of the first processing module 101 is arranged at a side, which is close to the active pattern of the second processing module 102, of the active pattern of the first PMOS region 115; the active pattern of the second NMOS region 124 is arranged at a side, which is away from the active pattern of the first processing module 101, of the active pattern of the second PMOS region 125; the active pattern of the second processing module 102 is arranged at a side, which is away from the active pattern of the first processing module 101, of the active pattern of the second PMOS region 125.

The active pattern of the first processing module 101 and the active pattern of the second processing module 102 are arranged in a same well region. As shown in FIG. 10, the active pattern of the first processing module 101 and the active pattern of the second processing module 102 are arranged in an eighth well region 1008.

For MOS structures of a sense amplifier in a readout circuit layout structure, active patterns of two NMOS transistors are independent of each other, and active patterns of two PMOS transistors are independent of each other, so that the active regions of MOS structures in the subsequently formed sense amplifier are independent of each other, which can reduce the signal interference caused by a shared active region in the MOS transistors, thereby improving the device performance of the MOS transistors in the readout circuit and reducing the impact of timing mismatch of the memory in the readout process.

Another embodiment of the present application further provides a memory layout structure, including a plurality of the readout circuit layout structures provided in the foregoing embodiment, where the plurality of the readout circuit layout structures are sequentially arranged along a direction perpendicular to the preset direction, two adjacent readout circuit layout structures form one readout circuit layout structure set, the readout circuit layout structure set shares one active pattern, and adjacent readout circuit layout structure sets are spaced apart by an equal distance.

Figure 11:
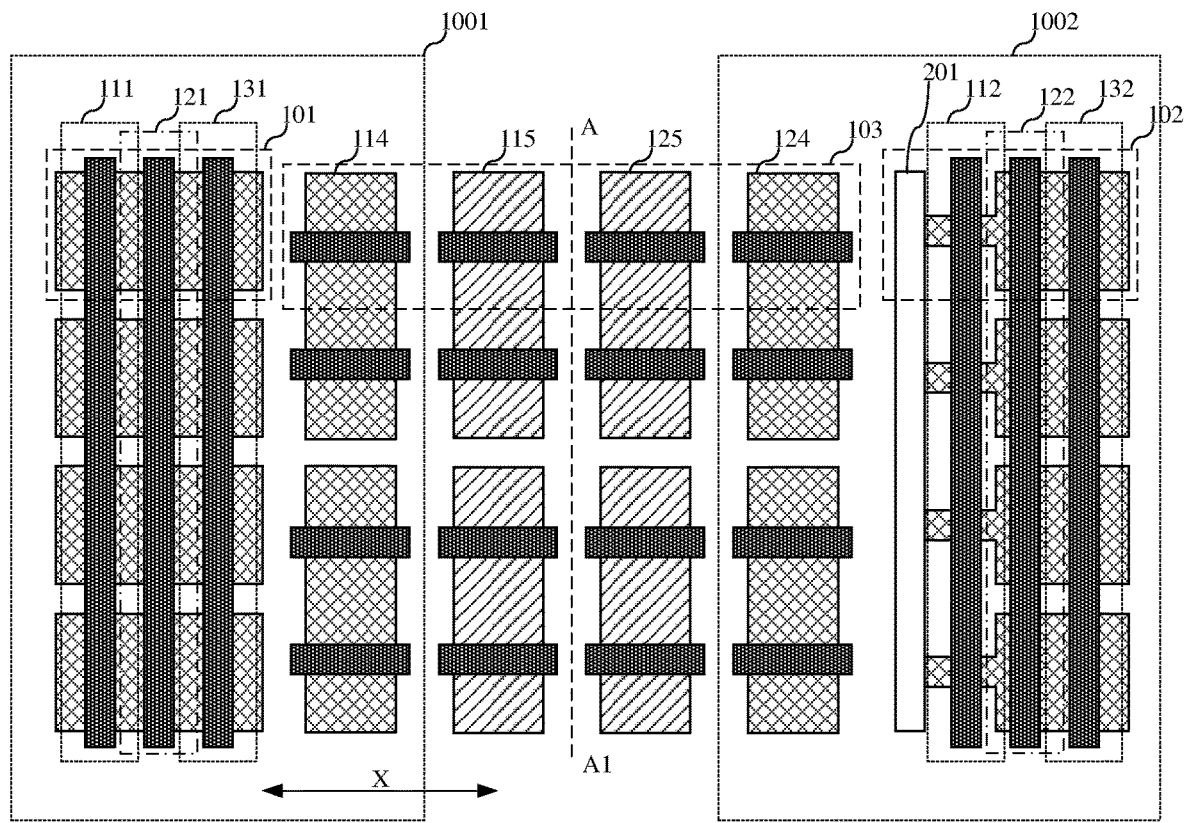
FIG. 11 is a schematic structural diagram of a memory layout structure according to another embodiment of the present application.

FIG. 11 is a schematic structural diagram of a memory layout structure according to this embodiment. The memory layout structure provided by this embodiment is further described in detail below with reference to the accompanying drawings.

Referring to FIG. 11, the memory layout structure includes a plurality of the readout circuit layout structures mentioned in the foregoing embodiments. The plurality of the readout circuit layout structures are sequentially arranged along a direction perpendicular to the preset direction. That is, the plurality of the readout circuit layout structures are arranged along a direction perpendicular to direction X.

Two adjacent readout circuit layout structures form a readout circuit layout structure set, the readout circuit layout structure set shares one active pattern, and adjacent readout circuit layout structure sets are spaced apart by an equal distance.

Specifically, referring to FIG. 11, in the direction perpendicular to the preset direction, 4 readout circuit layout structures are taken as an example for detailed description of this embodiment, which is merely intended to help those skilled in the art to understand the present application, but does not constitute any limitation on the present application.

Specifically, a first-column readout circuit layout structure and a second-column readout circuit layout structure form a first readout circuit layout structure set, and a third-column readout circuit layout structure and a fourth-column readout circuit layout structure form a second readout circuit layout structure set. In one readout circuit layout structure set, the first NMOS regions 114 share a same active pattern, the second NMOS regions 124 share a same active pattern, the first PMOS regions 115 share a same active pattern, and the second PMOS regions 125 share a same active pattern.

In the same memory layout structure, all the first processing modules 101 arranged in the direction perpendicular to the preset direction share a gate structure, and all the second processing modules 102 arranged in the direction perpendicular to the preset direction share a gate structure.

The adjacent readout circuit layout structure sets being spaced apart by an equal distance means that: every two adjacent readout circuit layout structure sets among the plurality of readout circuit layout structure sets are at an equal interval; for the first readout circuit layout structure set and the second readout circuit layout structure set, it means that a distance between the active patterns of the adjacent first processing modules 101, a distance between the active patterns of the adjacent second processing modules 102, a distance between the active patterns of the first NMOS regions 114, a distance between the active patterns of the second NMOS regions 124, a distance between the active patterns of the first PMOS regions 115, and a distance between the active patterns of the second PMOS regions 125 are equal.

Further referring to FIG. 11, each readout circuit layout structure includes:
 a readout amplification module 103, a first processing module 101, and a second processing module 102 arranged along a preset direction.

Specifically, the readout amplification module 103 includes: a first NMOS region 114 and a first PMOS region 115 arranged close to the first processing module 101, and a second NMOS region 124 and a second PMOS region 125 arranged close to the second processing module 102. An active pattern of the first NMOS region 114 and an active pattern of the second NMOS region 124 are symmetrical to each other; an active pattern of the first PMOS region 115 and an active pattern of the second PMOS region 125 are symmetrical to each other.

Correspondingly, a position of an active pattern of the first processing module 101 and a position of an active pattern of the second processing module 102 are symmetrical to each other.

For the first processing module 101, the first processing module 101 includes a first offset cancellation region 111, a first isolation region 121, and an equalization region 131, where the first offset cancellation region 111 is configured to connect a bit line BL to a complementary readout bit line SABLB, the first isolation region 121 is configured to connect the bit line BL to the readout bit line SABL, and the equalization region 131 is configured to connect the readout bit line SABL to a complementary readout bit line SABLB.

For the second processing module 102, the second processing module 102 includes a precharge region 112, a second isolation region 122, and a second offset cancellation region 132. The precharge region 112 is configured to precharge the bit line BL and the complementary bit line BLB based on a precharge instruction. The second isolation region 122 is configured to connect the complementary bit line BLB to the complementary readout bit line SABLB. The second offset cancellation region 132 is configured to connect the complementary bit line BLB to the readout bit line SABL.

As mentioned above, in this embodiment, the position of the active pattern of the first processing module 101 and the position of the active pattern of the second processing module 102 are symmetrical to each other. Specifically, the active pattern of the first offset cancellation region 111 and the active pattern of the second offset cancellation region 132 are symmetrical to each other; the active pattern of the first isolation region 121 and the active pattern of the second isolation region 122 are symmetrical to each other; the position of the active pattern of the equalization region 131 and the position of the active pattern of the precharge region 112 are symmetrical to each other.

In this embodiment, the memory layout structure further includes: a connection pattern 201, arranged at an edge of the precharge region 112 and being in contact with the active pattern of the precharge region 112. In the direction perpendicular to the preset direction, the connection pattern 201 is configured to be in contact with the active patterns of all the precharge regions 112. Because the size of the active pattern of the precharge region 112 is generally smaller than the size of active patterns of other regions, ambient active region "environments" of the first NMOS region 114 and the second NOS region 125 are balanced by the connection pattern 201, so as to balance device characteristics of MOS transistors in the same sense amplifier. It should be noted that, in this embodiment, the consistent "environments" mean that sizes, distances, arrangement modes, and other features of semiconductor structures formed by the same surrounding material are the same.

For MOS structures of a sense amplifier in the readout circuit layout structure, active patterns of two NMOS transistors are independent of each other, and active patterns of two PMOS transistors are independent of each other, so that the active regions of MOS structures in the subsequently formed sense amplifier are independent of each other, which can reduce the signal interference caused by a shared active region in the MOS transistors, thereby improving the device performance of the MOS transistors in the readout circuit and reducing the impact of timing mismatch of the memory in the readout process.

Since the foregoing embodiment corresponds to this embodiment, this embodiment may be implemented in cooperation with the foregoing embodiment. The related technical details mentioned in the foregoing embodiment are still valid in this embodiment, and the technical effects that may be achieved in the foregoing embodiment may also be achieved in this embodiment, which will not be repeated here. Correspondingly, the related technical details mentioned in this embodiment may also be applied to the foregoing embodiment.

Further another embodiment of the present application provides a readout circuit, including: a readout amplifier, a first processing circuit, and a second processing circuit arranged along a preset direction, where the readout amplifier is configured to read a voltage of a bit line, and the first processing circuit and the second processing circuit are at least configured to perform noise cancellation on an output signal of the readout amplifier. The readout amplifier includes: a first NMOS transistor and a first PMOS transistor arranged close to the first processing circuit, and a second NMOS transistor and a second PMOS transistor arranged close to the second processing circuit. The first processing circuit, the first NMOS transistor, the first PMOS transistor, the second processing circuit, the second NMOS transistor, and the second PMOS transistor are arranged along the preset direction. An active layer of the first NMOS transistor and an active layer of the second NMOS transistor are independent of each other, and an active layer of the first PMOS transistor and an active layer of the second PMOS transistor are independent of each other.

The readout circuit provided by this embodiment is further described in detail below. The readout circuit includes:

a readout amplifier, a first processing circuit, and a second processing circuit arranged along a preset direction, where the readout amplifier is configured to read a voltage of a bit line, and the first processing circuit and the second processing circuit are at least configured to perform noise cancellation on an output signal of the readout amplifier.

With reference to the foregoing embodiment, the readout amplification module 103 is configured for form the foregoing readout amplifier, the first processing module 101 is configured to form the foregoing first processing circuit, and the second processing module 102 is configured to form the foregoing second processing circuit.

The readout amplifier includes: a first NMOS transistor and a first PMOS transistor arranged close to the first processing circuit, and a second NMOS transistor and a second PMOS transistor arranged close to the second processing circuit. The first processing circuit, the first NMOS transistor, the first PMOS transistor, the second processing circuit, the second NMOS transistor, and the second PMOS transistor are arranged along the preset direction.

With reference to the foregoing embodiment, the first NMOS region 114 is configured to form the foregoing first NMOS transistor, the second NMOS region 124 is configured to form the foregoing second NMOS transistor, the first PMOS region 115 is configured to form the foregoing first PMOS transistor, and the second PMOS region 125 is configured to form the foregoing second PMOS transistor.

An active layer of the first NMOS transistor and an active layer of the second NMOS transistor are independent of each other; an active layer of the first PMOS transistor and an active layer of the second PMOS transistor are independent of each other.

For MOS structures of a sense amplifier in a readout circuit layout structure, active layers of two NMOS transistors are independent of each other, and active layers of two PMOS transistors are independent of each other, which can reduce the signal interference caused by a shared active layer in the MOS transistors, thereby improving the device performance of the MOS transistors in the readout circuit and reducing the impact of timing mismatch of the memory in the readout process.

Since the foregoing embodiment corresponds to this embodiment, this embodiment may be implemented in cooperation with the foregoing embodiment. The related technical details mentioned in the foregoing embodiment are still valid in this embodiment, and the technical effects that may be achieved in the foregoing embodiment may also be achieved in this embodiment, which will not be repeated here. Correspondingly, the related technical details mentioned in this embodiment may also be applied to the foregoing embodiment.

Those of ordinary skill in the art should understand that the above embodiments are specific embodiments for implementing the present application. In practical applications, various changes may be made to the above embodiments in terms of form and details without departing from the spirit and scope of the present application.

The invention claimed is:

1. A readout circuit layout structure, comprising:
a readout amplification module, a first processing module, and a second processing module arranged along a preset direction, wherein the readout amplification module is configured to read a voltage of a bit line, and the first processing module and the second processing module are at least configured to perform a noise cancellation on an output signal of the readout amplification module;
the readout amplification module comprises: a first n-type metal-oxide-silicon (NMOS) region and a first p-type metal-oxide-silicon (PMOS) region arranged close to the first processing module, and a second NMOS region and a second PMOS region arranged close to the second processing module, the first NMOS region, the first PMOS region, the second PMOS region, and the second NMOS region being arranged along the preset direction;
an active pattern of the first NMOS region and an active pattern of the second NMOS region are independent of each other, and an active pattern of the first PMOS region and an active pattern of the second PMOS region are independent of each other;
the first processing module comprises: a first offset cancellation region, a first isolation region, and an equalization region;
the first offset cancellation region is configured to connect the bit line to a complementary readout bit line, the first isolation region is configured to connect the bit line to a readout bit line, and the equalization region is configured to connect the readout bit line to the complementary readout bit line;
the second processing module comprises: a precharge region, a second isolation region, and a second offset cancellation region;
the precharge region is configured to precharge the bit line and a complementary bit line based on a precharge instruction, the second isolation region is configured to connect the complementary bit line to the complementary readout bit line, and the second offset cancellation region is configured to connect the complementary bit line to the readout bit line; and
an active pattern of the first offset cancellation region, an active pattern of the first isolation region, and an active pattern of the equalization region are interconnected; and an active pattern of the precharge region, an active pattern of the second isolation region, and an active pattern of the second offset cancellation region are interconnected.

2. The readout circuit layout structure according to claim 1, wherein the active pattern of the first NMOS region and the active pattern of the second NMOS region are symmetrical to each other, and the active pattern of the first PMOS region and the active pattern of the second PMOS region are symmetrical to each other.

3. The readout circuit layout structure according to claim 1, wherein a position of an active pattern of the first processing module and a position of an active pattern of the second processing module are symmetrical to each other.

4. The readout circuit layout structure according to claim 1, wherein
an active pattern of the first processing module is arranged between the active pattern of the first NMOS region and the active pattern of the first PMOS region; and an active pattern of the second processing module is arranged between the active pattern of the second NMOS region and the active pattern of the second PMOS region.

5. The readout circuit layout structure according to claim 4, wherein in the preset direction, the active pattern of the first NMOS region is arranged at a side of the active pattern of the first processing module away from the active pattern of the second processing module; the active pattern of the second NMOS region is arranged at a side of the active pattern of the second processing module away from the active pattern of the first processing module; and the active pattern of the first PMOS region and the active pattern of the second PMOS region are arranged between the active pattern of the first processing module and the active pattern of the second processing module.

6. The readout circuit layout structure according to claim 1, wherein in the preset direction, an active pattern of the first processing module is arranged at a side of the active pattern of the first NMOS region and the active pattern of the first PMOS region away from an active pattern of the second processing module; and the active pattern of the second processing module is arranged at a side of the active pattern of the second NMOS region and the active pattern of the second PMOS region away from the active pattern of the first processing module.

7. The readout circuit layout structure according to claim 6, wherein in the preset direction, the active pattern of the first PMOS region is arranged at a second side of the active pattern of the first NMOS region close to the active pattern of the second processing module; the active pattern of the first processing module is arranged at the side of the active pattern of the first NMOS region away from the active pattern of the second processing module; the active pattern of the second PMOS region is arranged at a second side of the active pattern of the second NMOS region close to the active pattern of the first processing module; and the active pattern of the second processing module is arranged at the side of the active pattern of the second NMOS region away from the active pattern of the first processing module.

8. The readout circuit layout structure according to claim 7, wherein the active pattern of the first processing module and the active pattern of the first NMOS region are arranged in a same well region, and the active pattern of the second processing module and the active pattern of the second NMOS region are arranged in a same second well region.

9. The readout circuit layout structure according to claim 1, wherein in the preset direction, an active pattern of the first processing module is arranged at a side of the active pattern of the first NMOS region and the active pattern of the first PMOS region close to an active pattern of the second processing module; and the active pattern of the second processing module is arranged at a side of the active pattern of the second NMOS region and the active pattern of the second PMOS region close to the active pattern of the first processing module.

10. The readout circuit layout structure according to claim 9, wherein in the preset direction, the active pattern of the first NMOS region is arranged at a second side of the active pattern of the first PMOS region away from the active pattern of the second processing module; the active pattern of the first processing module is arranged at the side of the active pattern of the first PMOS region close to the active pattern of the second processing module; the active pattern of the second NMOS region is arranged at a second side of the active pattern of the second PMOS region away from the active pattern of the first processing module; and the active pattern of the second processing module is arranged at the side of the active pattern of the second PMOS region close to the active pattern of the first processing module.

11. The readout circuit layout structure according to claim 9, wherein in the preset direction, the active pattern of the first PMOS region is arranged at a second side of the active pattern of the first NMOS region away from the active pattern of the second processing module; the active pattern of the first processing module is arranged at the side of the active pattern of the first NMOS region close to the active pattern of the second processing module; the active pattern of the second PMOS region is arranged at a second side of the active pattern of the second NMOS region away from the active pattern of the first processing module; and the active pattern of the second processing module is arranged at the side of the active pattern of the second NMOS region close to the active pattern of the first processing module.

12. The readout circuit layout structure according to claim 11, wherein the active pattern of the first processing module, the active pattern of the second processing module, the active pattern of the first NMOS region, and the active pattern of the second NMOS region are arranged in a same well region.

13. The readout circuit layout structure according to claim 1, wherein in the preset direction, a length of the active pattern of the first NMOS region is greater than a length of the active pattern of the first PMOS region; and a length of the active pattern of the second NMOS region is greater than a length of the active pattern of the second PMOS region;
a gate pattern of the first NMOS region, a gate pattern of the second NMOS region, a gate pattern of the first PMOS region, and a gate pattern of the second PMOS region are arranged along the preset direction, and a gate pattern of the first processing module and a gate pattern of the second processing module are arranged along a direction perpendicular to the preset direction.

14. A memory layout structure, comprising a plurality of the readout circuit layout structures according to claim 1, wherein the plurality of the readout circuit layout structures are sequentially arranged along a direction perpendicular to the preset direction, two adjacent readout circuit layout structures form a readout circuit layout structure set, the readout circuit layout structure set shares an active pattern, and adjacent readout circuit layout structure sets are spaced apart by an equal distance.

15. The memory layout structure according to claim 14, wherein the active pattern of the first NMOS region and the active pattern of the second NMOS region are symmetrical to each other, and the active pattern of the first PMOS region and the active pattern of the second PMOS region are symmetrical to each other.

16. The memory layout structure according to claim 15, wherein a position of an active pattern of the first processing module and a position of an active pattern of the second processing module are symmetrical to each other.

17. The memory layout structure according to claim 14, further comprising: a connection pattern, disposed at an edge of the precharge region and being in contact with the active pattern of the precharge region, wherein in the direction perpendicular to the preset direction, the connection pattern is configured to be in contact with the active patterns of all the precharge regions.

* * * * *